(12) United States Patent
Zhou

(10) Patent No.: US 9,882,030 B2
(45) Date of Patent: Jan. 30, 2018

(54) METHOD TO ENHANCE FINFET DEVICE PERFORMANCE WITH CHANNEL STOP LAYER DEPTH CONTROL

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/236,344

(22) Filed: Aug. 12, 2016

(65) Prior Publication Data
US 2017/0062591 A1 Mar. 2, 2017

(30) Foreign Application Priority Data
Sep. 1, 2015 (CN) .......................... 2015 1 0551016

(51) Int. Cl.
H01L 21/8234 (2006.01)
H01L 29/66 (2006.01)
H01L 21/311 (2006.01)
H01L 21/3115 (2006.01)
H01L 21/265 (2006.01)
H01L 29/06 (2006.01)
H01L 21/762 (2006.01)

(52) U.S. Cl.
CPC .. *H01L 29/66795* (2013.01); *H01L 21/26533* (2013.01); *H01L 21/31116* (2013.01); *H01L 21/31144* (2013.01); *H01L 21/31155* (2013.01); *H01L 21/76224* (2013.01); *H01L 29/0649* (2013.01)

(58) Field of Classification Search
CPC ......... H01L 29/66795; H01L 21/31116; H01L 21/31144; H01L 21/76224; H01L 21/26533; H01L 29/0649; H01L 21/31155; H01L 21/823431; H01L 21/823821; H01L 21/845
See application file for complete search history.

(56) References Cited

U.S. PATENT DOCUMENTS

2007/0087504 A1* 4/2007 Pham .................. H01L 21/3212
438/257
2012/0295444 A1* 11/2012 Godet ............... H01L 21/02321
438/694

(Continued)

*Primary Examiner* — Bitew Dinke
(74) *Attorney, Agent, or Firm* — Kilpatrick Townsend and Stockton LLP

(57) ABSTRACT

A method for manufacturing a fin-type semiconductor device includes providing a semiconductor structure comprising a plurality of fins, and a plurality of trenches each disposed between two adjacent fins, filling each of the trenches with a spacer, and performing a first dopant implantation into the spacer to form an etch stop layer. The thus formed etch stop layer can decrease the etch rate of the HF/SiCoNi etchant towards oxide, e.g., silicon oxide, thereby reducing the spacer loss in a subsequent HF/SiCoNi etch of the dummy gate insulation layer, and improving the device performance.

7 Claims, 14 Drawing Sheets

(56) References Cited

U.S. PATENT DOCUMENTS

| | | | | |
|---|---|---|---|---|
| 2013/0161729 A1* | 6/2013 | Xie | H01L 29/66795 | 257/329 |
| 2013/0230953 A1* | 9/2013 | Sudo | H01L 29/785 | 438/268 |
| 2013/0252349 A1* | 9/2013 | Pradhan | H01L 21/26513 | 438/4 |
| 2014/0145250 A1* | 5/2014 | Cheng | H01L 29/16 | 257/289 |
| 2014/0225219 A1* | 8/2014 | Huang | H01L 29/66795 | 257/510 |
| 2015/0069474 A1* | 3/2015 | Ching | H01L 29/7842 | 257/288 |
| 2016/0133696 A1* | 5/2016 | Yin | H01L 29/66803 | 257/402 |
| 2016/0218199 A1* | 7/2016 | Tsai | H01L 29/66803 | |
| 2016/0225906 A1* | 8/2016 | Wang | H01L 29/7856 | |
| 2016/0329435 A1* | 11/2016 | Fanelli | H01L 29/78696 | |
| 2017/0025535 A1* | 1/2017 | Wu | H01L 29/7843 | |

* cited by examiner

METHOD TO ENHANCE FINFET DEVICE PERFORMANCE WITH CHANNEL STOP LAYER DEPTH CONTROL

CROSS-REFERENCES TO RELATED APPLICATIONS

This application claims priority to Chinese patent application No. 201510551016.6, filed on Sep. 1, 2015, the content of which is incorporated herein by reference in its entirety.

BACKGROUND OF THE INVENTION

The present invention relates generally to semiconductor technology, and more particularly relates to a fin-type semiconductor device and method of forming the same.

As the feature size of metal oxide semiconductor field-effect transistors (MOSFETs) continues to decrease, short channel effects have become a critical design issue due to the reduction in size of the gate length. Fin Field-effect transistors (FinFET) exhibit excellent gate controllability on channel charge and superior electrostatic control capability, so that the feature size of complementary metal oxide semiconductor (CMOS) devices can be further reduced, such as process nodes below 20 nm.

The present inventor has discovered that, in the conventional method of forming a FinFET device, the filler material disposed between the fins may be removed by etching, causing impurities to migrate into the channel region, thereby reducing the FinFET performance.

FIG. 1A is a schematic cross-sectional view of a structure illustrating a conventional Fin-type semiconductor device, as known in the prior art. FIG. 1B is a schematic cross-sectional views of a structure illustrating the etching loss of an insulating layer deposited between the fins in a step of forming a conventional Fin-Type semiconductor device, as known in the prior art.

Referring to FIGS. 1A and 1B, a channel stop layer 104 having a higher doping concentration is formed outside the channel region through a channel stop implantation process in the fin 102. In subsequent manufacturing processes, a dummy gate and a dummy gate oxide, such as silicon dioxide (not shown in FIGS. 1A and 1B) are formed on the fin 102. Thereafter, the dummy gate and the dummy gate oxide are removed, and a high dielectric constant (high-k) gate dielectric layer is deposited. In the process of removing the dummy gate and/or the dummy gate oxide, an etchant e.g., hydrogen fluoride (HF) and pre-clearing SiCoNi process, may be used to etch the spacer 103, causing the top surface 1031 of the spacer 103 to be lower than the top surface 1041 of the channel stop layer 104, such that at least a portion of the channel stop layer 104 is disposed above the spacer 103, as shown in FIG. 1B. Since the high-k dielectric gate covers the fin portion 1020 above the spacer 103, the portion of the fin covered by the high-k gate forms the channel region, i.e., the portion of the fin 1020 above the spacer 103 is the channel region. That is, the channel stop layer 104 is partially disposed within the channel region, and the relatively higher impurity doping concentration of the channel stop layer degrades the device performance. Thus, the present inventor has discovered the height loss of the spacer causes the degradation of the device performance. Furthermore, because of the spacer height loss due to etching, the bottom portion of the fin has become wider (as shown in FIG. 1B), thereby reducing the short channel performance and the device performance.

Thus, there is a need to provide a novel Fin-type semiconductor device and manufacturing method thereof to overcome the above-described drawbacks.

BRIEF SUMMARY OF THE INVENTION

The present inventor has discovered that spacer oxide may suffer loss in the manufacturing process of a FinFET device, so that the channel region may include a channel stop layer. The relatively high impurity concentration in the channel region may degrade the performance of the FinFET device.

Embodiments of the present invention provide a method for manufacturing a fin-type semiconductor device to overcome such drawbacks. The method includes providing a semiconductor structure comprising a plurality of fins and a plurality of trenches each disposed between two adjacent fins, filling each of the trenches with a spacer, and performing a first dopant implantation into the spacer to form an etch stop layer.

In one embodiment, the first dopant implantation may include silicon, carbon, or a combination thereof. The first dopant implantation may be an ion implantation comprising silicon ions, carbon ions, or a combination thereof In one embodiment, the etch stop layer has an upper surface that is an upper surface of the spacer.

In one embodiment, the ion implantation is performed in a perpendicular direction to the upper surface of the spacer at an energy in a range between 0.5 keV and 3 keV, and with a doping concentration in a range between $1.0 \times 10^{15}$ and $8.0 \times 10^{16}$ atoms/cm$^3$.

In one embodiment, the method may further include submitting the etch stop layer to an annealing treatment at a temperature in a range between 850° C. and 1050° C.

In one embodiment, the method may further include, after the first dopant implantation and prior to the annealing treatment, performing a channel stop implantation process into the fins to form a channel stop layer. The formed channel stop layer has an upper surface below an upper surface of the etch stop layer.

In one embodiment, the method also includes forming a dummy gate insulation layer on the fins, a dummy gate on the dummy gate insulation layer, a source and drain adjacent the dummy gate, forming an interlayer dielectric layer to insulate the fins, removing the dummy gate and the dummy gate insulation layer, and forming a high-k dielectric layer and a gate on each of the fins.

In one embodiment, providing the semiconductor structure may include providing a substrate, performing a second dopant implantation into the substrate to form a well region, forming a patterned hard mask on the well region, performing an etching process onto the substrate using the patterned hard mask as a mask to form a fin structure having the plurality of fins and the plurality of trenches, filling each of the trenches with a spacer comprising an oxide liner and a filler material, planarizing the spacer until a surface of the hard mask is exposed and performing an etching process into the spacer to remove a portion of the spacer.

Embodiments of the present invention also provide a fin-type semiconductor device. The fin-type semiconductor device includes a semiconductor structure comprising a plurality of fins formed in a substrate and a plurality of trenches each disposed between two adjacent fins, a spacer in each of the trenches, and an etch stop layer disposed below an upper surface of the spacer.

In one embodiment, the etch stop layer comprises silicon, carbon, or a combination thereof. The etch stop layer has an upper surface that is an upper surface of the spacer.

In one embodiment, the fin-type semiconductor device also includes a channel stop layer in the fins. The channel stop layer has an upper surface that is below an upper surface of the etch stop layer.

In one embodiment, the fin-type semiconductor device may further include a high-k dielectric layer on the fins, a gate on the high-k dielectric layer, and a source and a drain adjacent the gate.

The etch stop layer formed using the method of the present invention may decrease the etch rate of the HF/SiCoNi etchant towards oxide, e.g., silicon oxide, thereby reducing the spacer loss in a subsequent HF/SiCoNi etch of the dummy gate insulation layer, and improving the device performance.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1A:
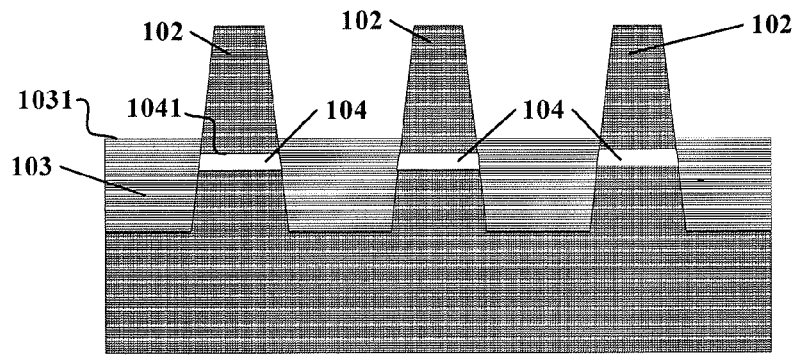
FIG. 1A is a schematic cross-sectional view of a structure illustrating a conventional Fin-type semiconductor device, as known in the prior art.
Figure 1B:
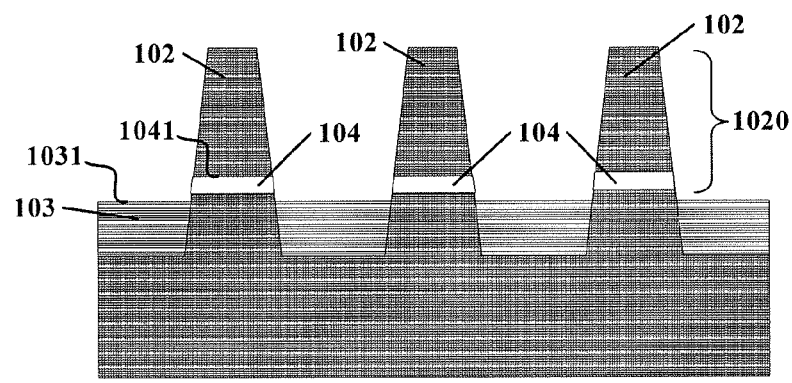
FIG. 1B is a schematic cross-sectional view of a structure illustrating the etching loss of an insulating layer deposited between the fins in a step of forming a conventional Fin-Type semiconductor device, as known in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Figure 2:
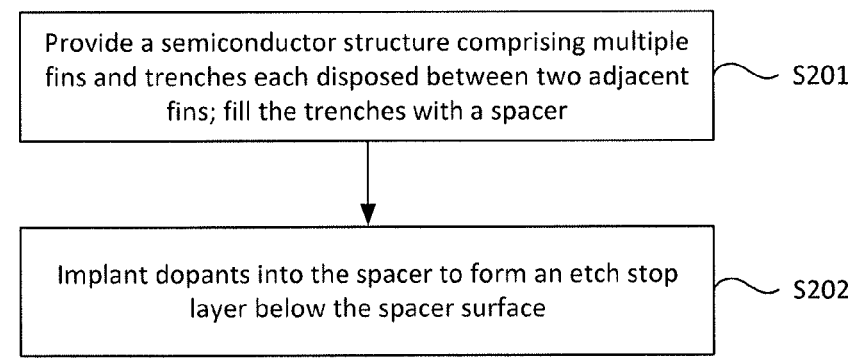
FIG. 2 is a simplified flowchart illustrating a method for manufacturing a semiconductor device according to various embodiments of the present invention.

FIG. 2 is a simplified flowchart illustrating methods for manufacturing a semiconductor device according to various embodiments of the present invention. FIGS. 3A through 3H are schematic cross-sectional views of intermediate stages of a method for manufacturing a fin-type semiconductor device according to one embodiment of the present invention.

A method for manufacturing a fin-type semiconductor device will be described in more detail with reference to FIGS. 2 and 3A though 3H. In an embodiment of the present invention, the method may include:

S201: providing a semiconductor structure. The semiconductor structure includes a plurality of fins and trenches each disposed between two adjacent fins. Each of the trenches is filled with an insulation material to form a spacer (e.g., trench isolation structure). Referring to FIG. 3A, the semiconductor structure includes a plurality of fins 302 and trenches 320 disposed between the fins. The trenches each are filled with an insulation material to form a plurality of spacers 303 having a surface 3031 (collectively referred to as the spacer 303). In some embodiments. The fins 302 and a base layer 301 disposed below the fins may comprise silicon. The spacer 303 may be made of oxide (e.g., silicon oxide) or nitride (e.g., silicon nitride).

S202: performing a first dopant implantation into the spacer to form an etch stop layer below the surface of the spacer. Referring to FIG. 3B, the first dopant implantation 31 is performed into the spacer 303 disposed in trench 320, so that an etch stop layer 305 is formed in a portion below the surface of the spacer 303. In certain embodiments, the first dopant implantation may include silicon and/or carbon.

In certain embodiments, the first dopant implantation may be an ion implantation. The ions implanted into the spacer may be silicon ions and/or carbon ions. The ion implantation may be performed perpendicular into (the normal direction) the surface of the spacer. The ion implantation may also be performed at a tilt angle relative to the perpendicular direction to the upper surface of the spacer 303, i.e., the direction of the ion implantation and the normal direction of the spacer surface form an angle. The angle may be in the range between 10 degrees and 30 degrees.

Figure 3A:
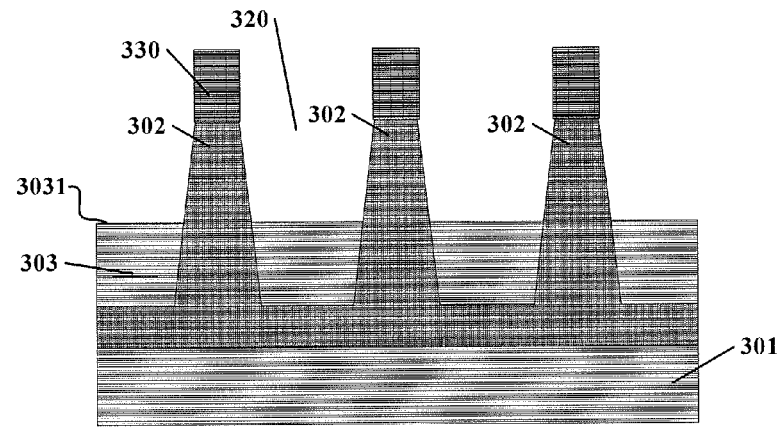
FIG. 3A is a schematic cross-sectional view of a structure illustrating an intermediate step of a method of forming a semiconductor device according to an embodiment of the present invention.
Figure 3B:
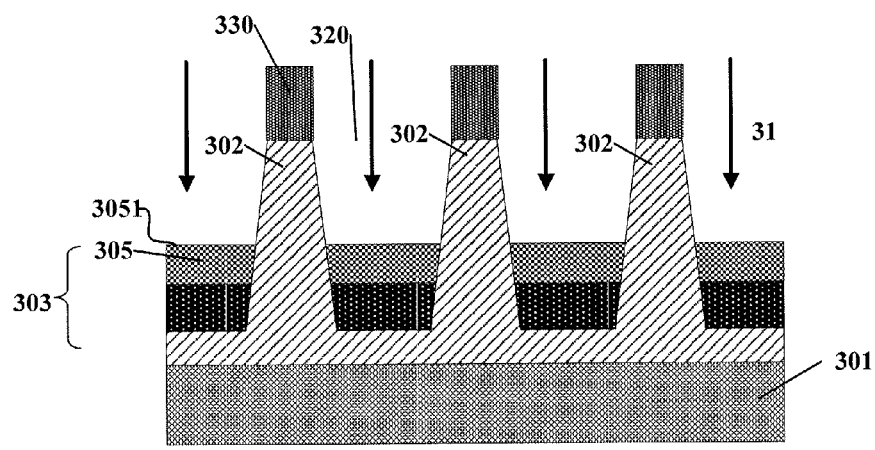
FIG. 3B is a schematic cross-sectional view of a structure illustrating an intermediate step of a method of forming a semiconductor device after an ion implantation according to an embodiment of the present invention.

Referring to FIGS. 3A and 3B, a patterned hard mask 330 may be formed on the fins 302. In an exemplary embodiment, a silicon nitride layer may be used as a hard mask 330. An ion implantation 31 is performed onto the spacer in the trenches. Since the fins are covered by the hard mask, the ions, e.g., silicon ions and/or carbon ions, do not penetrate the fins. The hard mask is then removed after the completion of the ion implantation.

In certain embodiments, the ion implantation is performed at an energy range of 0.5 keV to 3 keV and with an ion concentration in the range between $1.0 \times 10^{15}$ to $8.0 \times 10^{16}$ atoms/cm$^3$. In some other embodiments, the ion implantation can be performed using other processes, such as a diffusion process.

The etch stop layer may include compositions of oxide or nitride with silicon (e.g., composition of silicon oxide and silicon), compositions of oxide or nitride with carbon (e.g., composition of silicon oxide and carbon), or other compositions including silicon and/or carbon. The compositions of silicon and/or carbon and oxide or nitride can reduce the HF/SiCoNi etch rate of oxide, such as silicon oxide, therefore, in a subsequent etching process of a dielectric material of a dummy gate (e.g., silicon oxide) the spacer loss will be reduced, thereby improving the device performance (e.g., a device with 14 nm process node).

In some embodiments, referring to FIG. 3B, the top surface 3051 of the etch stop layer 305 is the surface 3031 of the spacer 303, as shown in FIG. 3A. In other embodiments, the surface 3051 of the etch stop layer 305 may be lower than the surface 3031 of the spacer 303. Regardless whether or not the surface of the etch stop layer is equal to or lower than the surface of the spacer, it is important to ensure the surface of the etch stop layer is higher than the surface of the channel stop layer formed by an channel stop implantation process. Thus, in a subsequent etching process of the dielectric material of a dummy gate, a portion of the channel stop layer that may be higher than the spacer caused by the spacer loss can be prevented, so that a portion of the channel stop layer can also be prevented from disposing into the channel region, thereby improving the device performance.

Thus, an etch stop layer can be formed on the spacer disposed in the trench between two adjacent fins of the semiconductor structure.

Figure 3C:
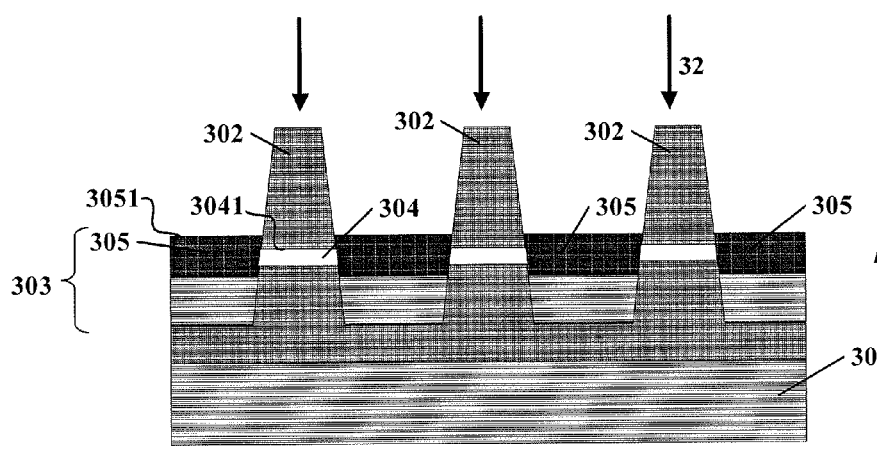
FIG. 3C is a schematic cross-sectional view of a structure illustrating an intermediate step of a method of forming a semiconductor device after a channel stop implantation according to an embodiment of the present invention.

Next, referring to FIG. 3C, a channel stop implantation process 32 is performed into the fins 302 to form a channel stop layer 304, so that the upper surface of the channel stop layer 3041 is lower than the surface 3051 of the etch stop layer 305. This ensures that, in a subsequent process, the channel stop layer 304 is not present in any portion of the channel region. For the formation of an NMOS device, the channel stop implantation may be performed with a boron trifluoride dopant, at an energy range of 8 keV to 20 keV, and a doping concentration in the range between $1.0 \times 10^{13}$ and $1.0 \times 10^{14}$ atoms/cm$^3$. For the formation of a PMOS device, the channel stop implantation may be performed with arsenic, at an energy range of 50 keV to 100 keV, and a doping concentration in the range between $5.0 \times 10^{12}$ and $5.0 \times 10^{13}$ atoms/cm$^3$. Of course, those skilled in the art will recognize that other proper process conditions may exist.

In some embodiments, if a hard mask is formed on the fins, such as the hard mask 330, the hard mask will be removed, then a capping layer is formed on the fins, e.g., the capping layer may be a liner oxide. Thereafter, a channel stop implantation process is performed on the fins 302. The capping layer can advantageously control the depth of the channel stop layer formed into the fins, such that the upper surface of the channel stop layer is lower than the upper surface of the etch stop layer.

Figure 3D:
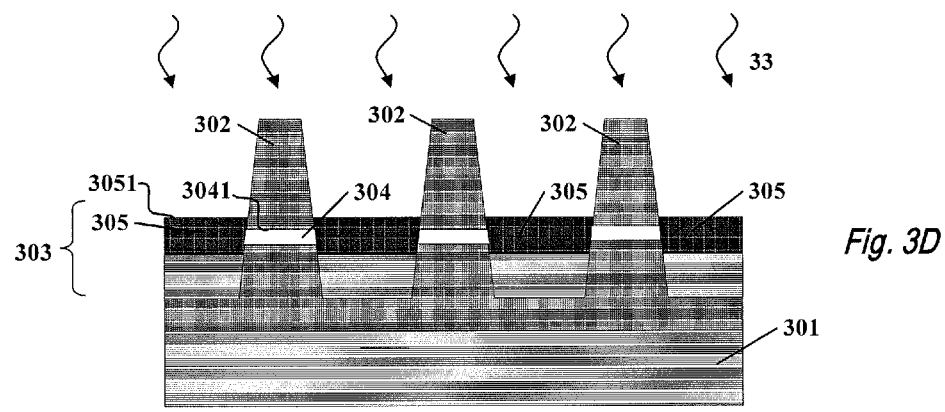
FIG. 3D is a schematic cross-sectional view of a structure illustrating an intermediate step of a method of forming a semiconductor device after an annealing treatment according to an embodiment of the present invention.

Next, referring to FIG. 3D, an annealing process 33 is performed on the etch stop layer 305. Through the annealing treatment, damage to the etch stop layer inflicted by the first implantation 31 is reduced. The etch rate of an etchant to the etch stop layer may also be reduced, thereby reducing the spacer loss. In some embodiments, the annealing process may be a spike annealing process at a temperature in the range between about 850° C. and about 1050° C. In other embodiments, other annealing processes may also be used, such as a rapid thermal annealing or laser annealing process.

Figure 3E:
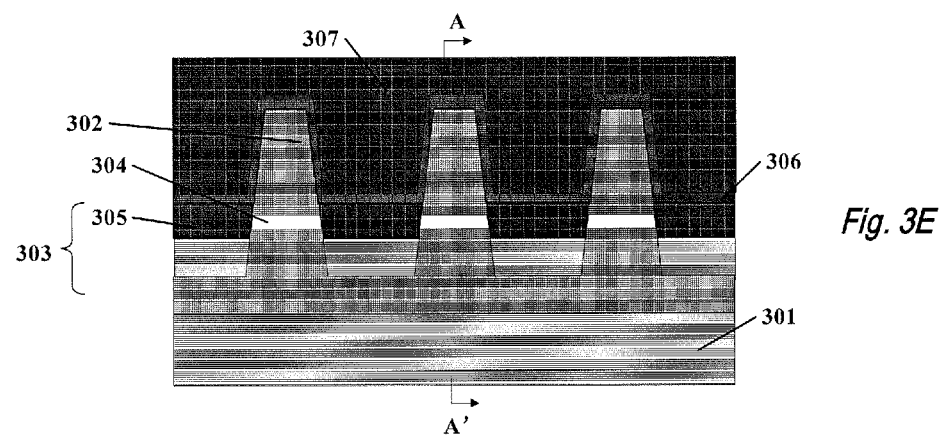
FIG. 3E is a schematic cross-sectional view of a structure illustrating an intermediate step of a method of forming a semiconductor device after forming a dummy gate according to an embodiment of the present invention.
Figure 3F:
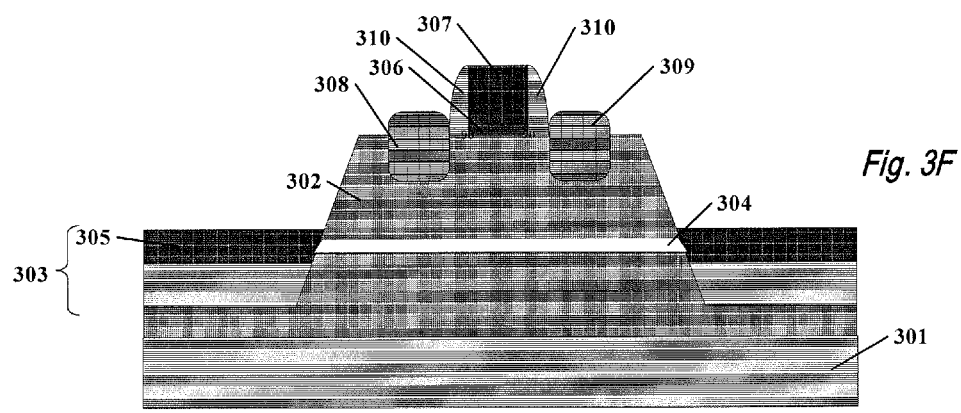
FIG. 3F is a schematic cross-sectional view of a structure illustrating an intermediate step of a method of forming a semiconductor device of FIG. 3E.

Next, referring to FIGS. 3E and 3F, a dummy gate insulation layer (e.g., dummy gate silicon dioxide) 306, a dummy gate 307, a source 308 and a drain 309 are formed on the fins 302. In some embodiments, a dummy gate insulation material (e.g., silicon dioxide) and a dummy gate material (e.g., polysilicon) are sequentially formed on the fins 302, the dummy gate material is then planarized. Thereafter, a patterned mask is formed on the planarized dummy gate material, portions of the dummy gate material and dummy gate insulation material not covered by the patterned mask are then removed by etching to form a desired shape of the dummy gate insulation layer 306 and the dummy gate 307. Thereafter, a source 308 and a drain 309 may be formed through an epitaxial process. In an exemplary embodiment, for an NMOS device, the source and drain may be formed using a SiC epitaxial process. For a PMOS device, the source and drain may be formed using a SiGe epitaxial process. In other exemplary embodiments, after the formation of the dummy gate insulation layer 306 and dummy gate 307, and prior to forming the source 308 and the drain 309, a spacer material 310 may be formed to prevent electrical connections from forming between the gate, source, and drain.

Figures 3G, 3H:
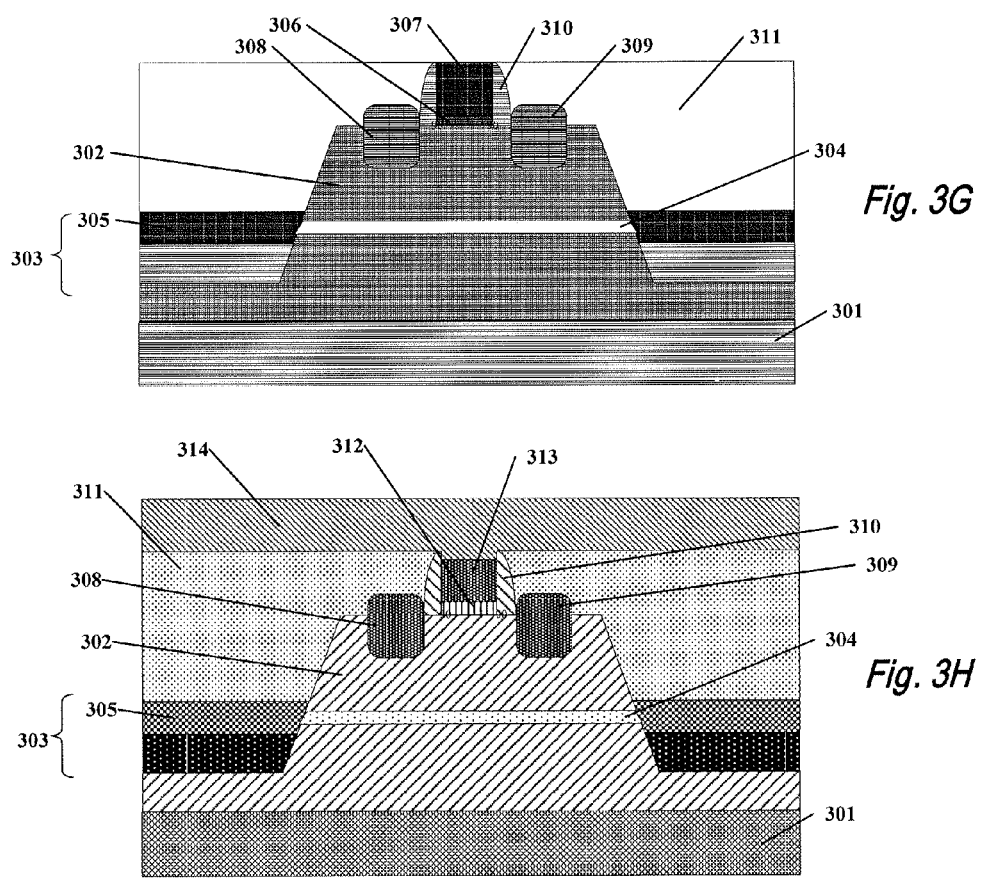
FIG. 3G is a schematic cross-sectional view of a structure illustrating an intermediate step of a method of forming a semiconductor device after forming a dielectric layer according to an embodiment of the present invention.
FIG. 3H is a schematic cross-sectional view of a structure illustrating an intermediate step of a method of forming a semiconductor device after forming a high-k gate according to an embodiment of the present invention

Next, referring to FIG. 3G, an interlayer dielectric layer 311 is deposited on the semiconductor structure to insulate the fins. Although only one fin is shown in FIG. 3G, it is understood that the semiconductor structure may include any number of fins, such as two or more fins. By depositing the interlayer dielectric layer (e.g., silicon dioxide) on the semiconductor structure, an electrical connection between the individual fins may be prevented.

Next, the dummy gate 307 and the dummy gate insulation material 306 are removed. For example, the dummy gate 307 may be removed using a first selective etching process, then the dummy gate insulation layer 306 may be removed using a second selective etching process, e.g., using an HF/SiCoNi etchant. In some embodiments, prior to removing the dummy gate 307 and the dummy gate insulation layer 306, a planarization process may be performed, e.g., a chemical mechanical planarization (CMP) process, to expose the dummy gate 307, thereby facilitating the removal of the dummy gate and the dummy gate insulation material, as shown in FIG. 3G.

Next, referring to FIG. 3H, a high dielectric constant (high-k) gate dielectric material 312 is formed on the fins 302, and a gate 313 is formed on the high-k dielectric material 312. For example, the high-k dielectric material can be formed on the fins by a deposition process, and a gate is then deposited on the high-k dielectric material. In some embodiments, the gate may include titanium, aluminum, tantalum, and potassium. In a further process step, a word line 314 may be formed by deposition and in electrical contact with the gate.

The formation of a fin-type semiconductor device has thus been provided in the above-described processes according to an embodiment of the present invention.

In other embodiments of the present invention, the above-described method for manufacturing a fin-type semiconductor device may further include forming first and second connection members configured to electrically connect the source and drain to other devices, respectively.

In some embodiments, the thus formed semiconductor device as shown in FIGS. 3A through 3H may be a single fin-type semiconductor device, such as an NMOS device or a PMOS device. In other embodiments, multiple fin-type semiconductor devices may be formed on the same substrate or the base layer. For example, an NMOS device may be formed on a first fin, and a PMOS device may be formed on a second fin. The number of formed fin-type semiconductor devices can be based on applications or design requirements.

FIGS. 4A through 4F are schematic cross-sectional views of intermediate stages of a method for manufacturing a semiconductor structure according to another embodiment of the present invention.

Figure 4A:
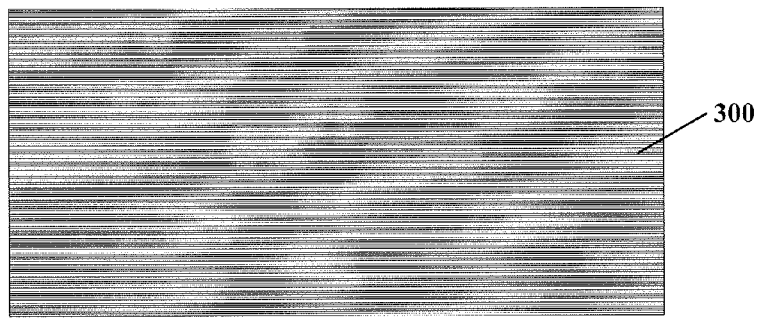
FIG. 4A is a schematic cross-sectional view of a structure illustrating an intermediate step of a method of forming a semiconductor device according to an embodiment of the present invention.
Figure 4B:
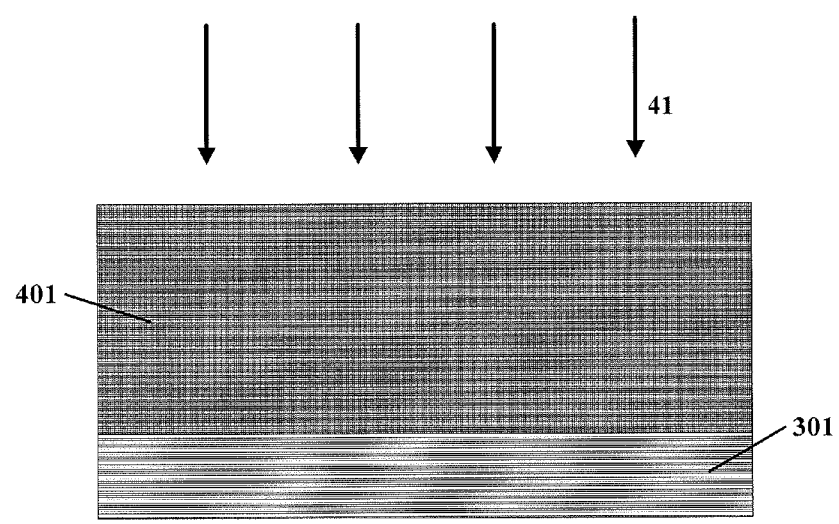
FIG. 4B is a schematic cross-sectional view of a structure illustrating an intermediate step of a method of forming a semiconductor device after a first dopant implantation according to an embodiment of the present invention.

Referring to FIG. 4A, a substrate 300 is provided, such as a silicon substrate. A dopant implantation 41 is performed into the substrate 300 to formed a well region 401. A base layer 301 is the portion of the substrate that is not formed as the well region, as shown in FIG. 4B. The dopant implantation 41 may be an ion implantation. In some embodiments, the well region may include an N-well region or a P-well region. In other embodiments, the well region may include an N-well region and a P-well region. In an exemplary embodiment, a portion of the substrate that is designated as a P-well region is covered using a first patterned mask, a dopant implantation is performed on the exposed portion of the substrate to form an N-well region. The first patterned mask is removed. Next, a second patterned mask is formed covering the N-well region and exposing the portion that is designated as the P-well region, a dopant implantation is performed into the exposed portion of the substrate to form the P-well region, then the second patterned mask is removed.

Figure 4C:
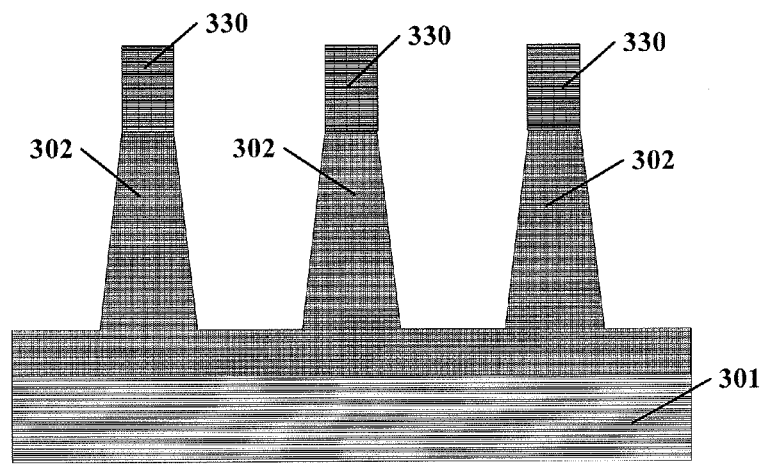
FIG. 4C is a schematic cross-sectional view of a structure illustrating an intermediate step of a method of forming a semiconductor device after an etching process according to an embodiment of the present invention.

Next, referring to FIG. 4C, a patterned hard mask 330 is formed on the well region. An etch process is performed on the substrate using the patterned hard mask 330 as a barrier layer to form a fin structure having multiple fins 302 separated by trenches. For example, the hard mask 330 may be silicon nitride or photoresist.

Figure 4D:
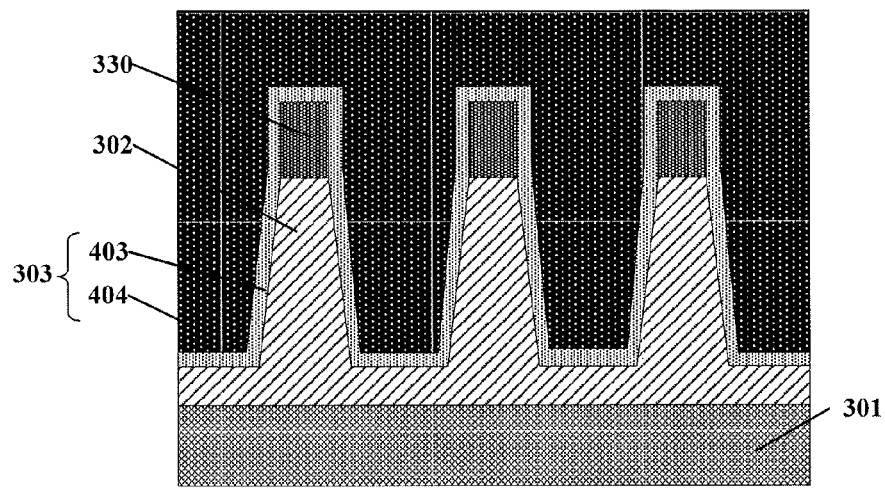
FIG. 4D is a schematic cross-sectional view of a structure illustrating an intermediate step of a method of forming a semiconductor device after forming a spacer according to an embodiment of the present invention.

Next, referring to FIG. 4D, spacers 303 are formed in the trenches by deposition. The spacers 303 may include an oxide liner 403 and a filler material 404. In an exemplary embodiment, an oxide liner (e.g., silicon dioxide) may first be deposited, and a filler material may then be deposited using a flowable chemical vapor deposition process. In other embodiments, an oxide liner may not be deposited so that a filler material may be directly deposited in the trenches to form the spacers.

Figure 4E:
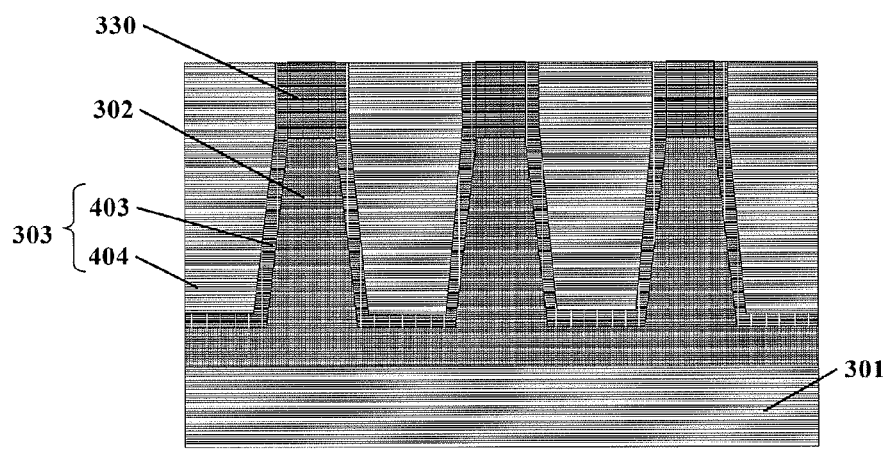
FIG. 4E is a schematic cross-sectional view of a structure illustrating an intermediate step of a method of forming a semiconductor device after a planarization process according to an embodiment of the present invention.

Next, referring to FIG. 4E, a planarization process is performed on the filler material until the upper surface of the hard mask 330 is exposed. The planarization process may be a chemical mechanical polishing (CMP) process.

Figure 4F:
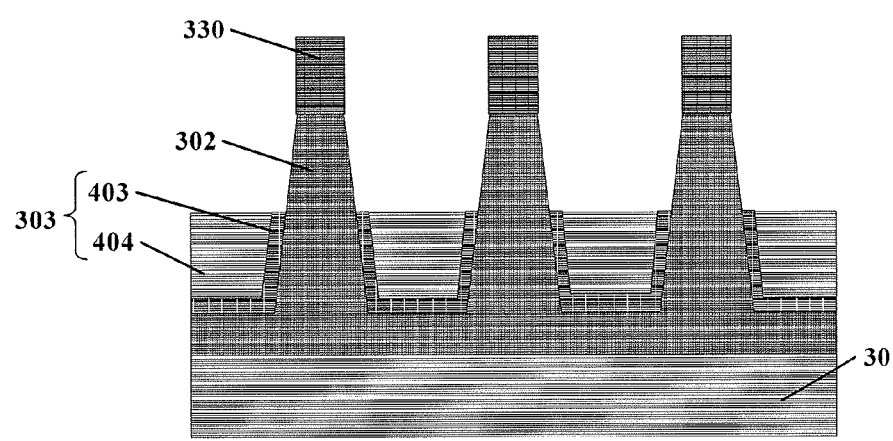
FIG. 4F is a schematic cross-sectional view of a structure illustrating an intermediate step of a method of forming a semiconductor device after an etching process according to an embodiment of the present invention.

Next, referring to FIG. 4F, an etching process is performed to remove a portion of the spacers 303. In some embodiments, the hard mask 330 is also removed.

A semiconductor structure is thus formed. The semiconductor structure includes multiple fins, trenches disposed between two adjacent fins, and each trench is partially filled with a spacer.

Figure 5A:
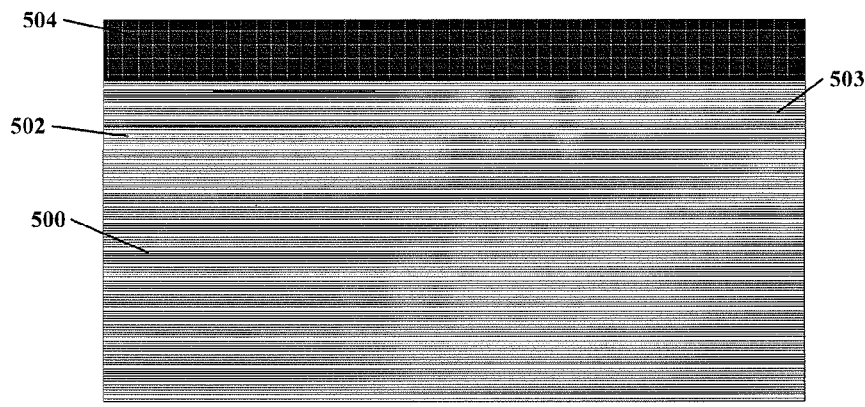
FIG. 5A is a schematic cross-sectional view of a structure illustrating an intermediate step of a method of forming a semiconductor device according to an embodiment of the present invention.
Figure 5B:
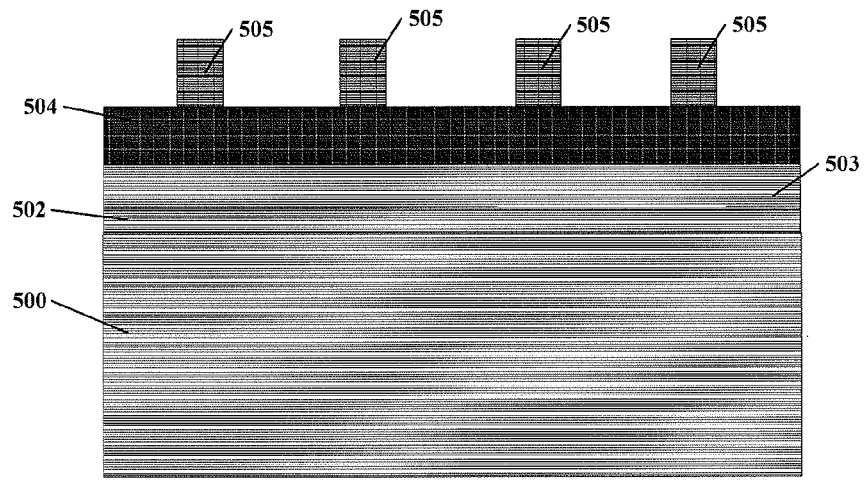
FIG. 5B is a schematic cross-sectional view of a structure illustrating an intermediate step of a method of forming a semiconductor device after forming a patterned mask on a sacrificial layer according to an embodiment of the present invention.
Figure 5C:
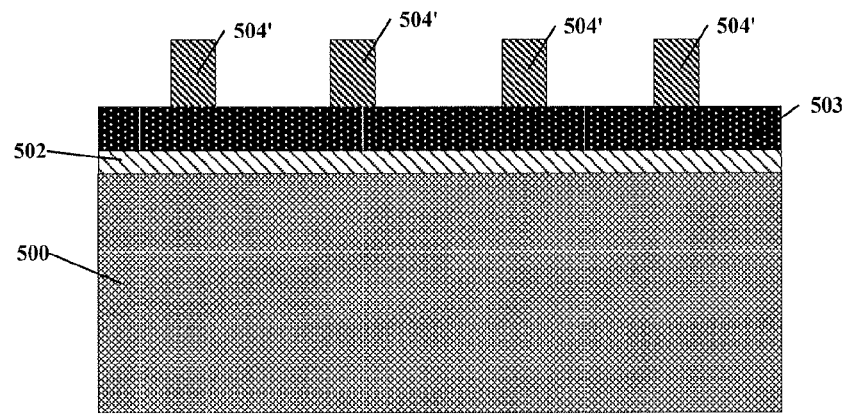
FIG. 5C is a schematic cross-sectional view of a structure illustrating an intermediate step of a method of forming a semiconductor device after an etching process according to an embodiment of the present invention.
Figure 5D:
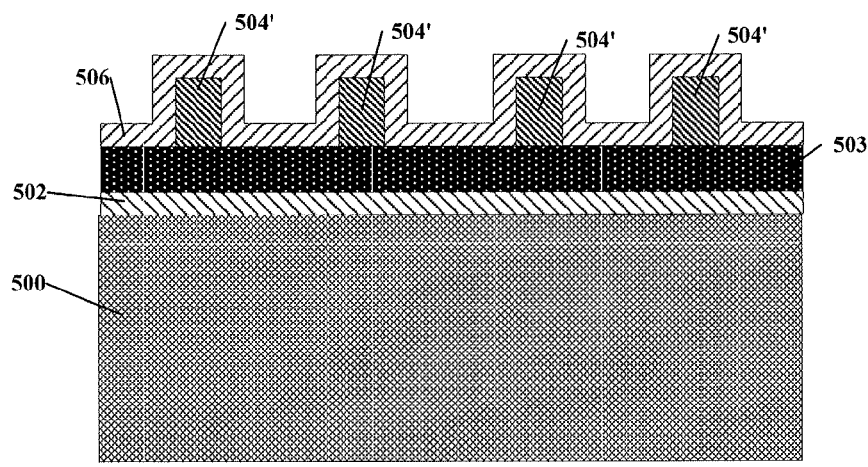
FIG. 5D is a schematic cross-sectional view of a structure illustrating an intermediate step of a method of forming a semiconductor device after forming a first spacer according to an embodiment of the present invention.
Figure 5E:
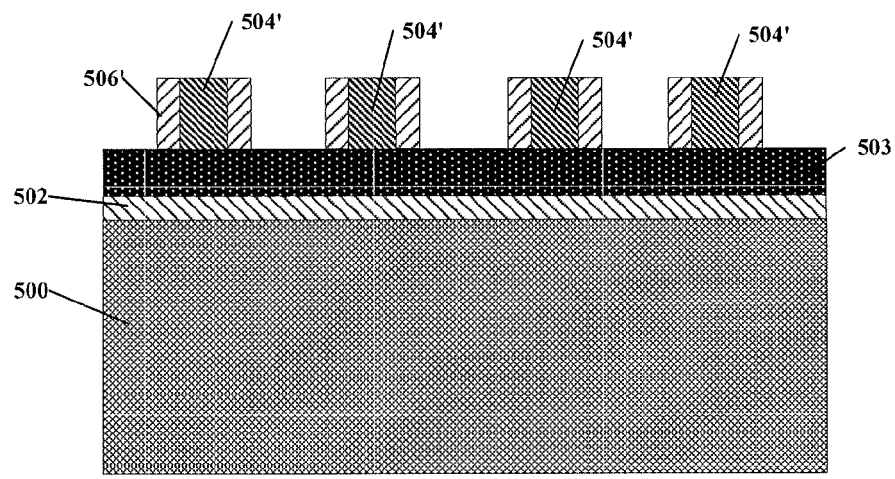
FIG. 5E is a schematic cross-sectional view of a structure illustrating an intermediate step of a method of forming a semiconductor device after an etching process according to an embodiment of the present invention.
Figure 5F:
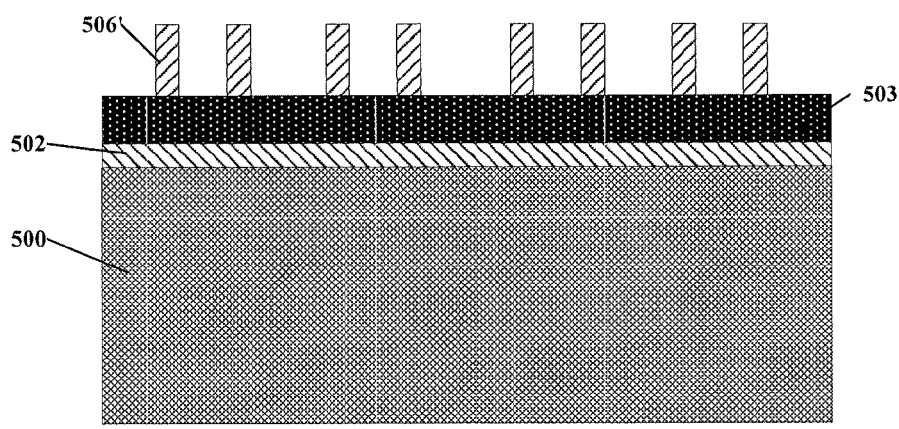
FIG. 5F is a schematic cross-sectional view of a structure illustrating an intermediate step of a method of forming a semiconductor device after removal the sacrificial layer according to an embodiment of the present invention.
Figure 5G:
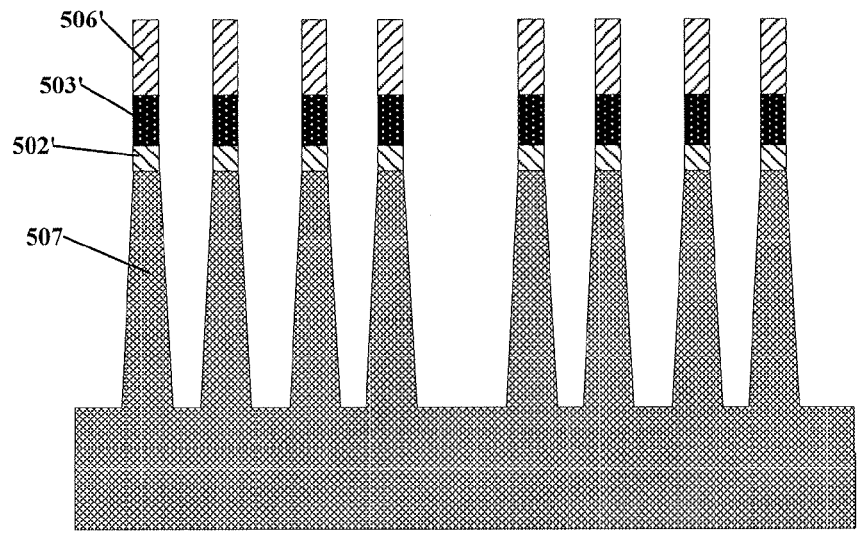
FIG. 5G is a schematic cross-sectional view of a structure illustrating an intermediate step of a method of forming a semiconductor device after forming the fins according to an embodiment of the present invention.
Figure 5H:
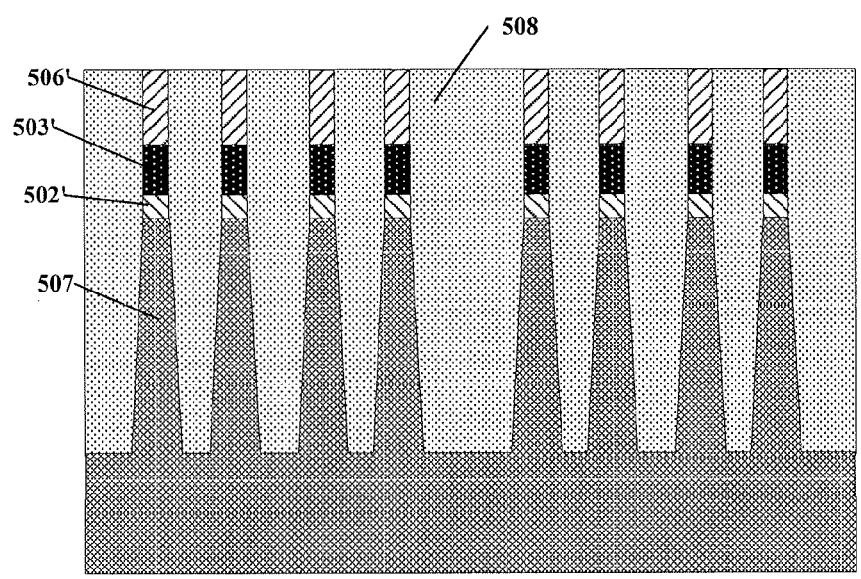
FIG. 5H is a schematic cross-sectional view of a structure illustrating an intermediate step of a method of forming a semiconductor device after forming the spacer according to an embodiment of the present invention.
Figure 5I:
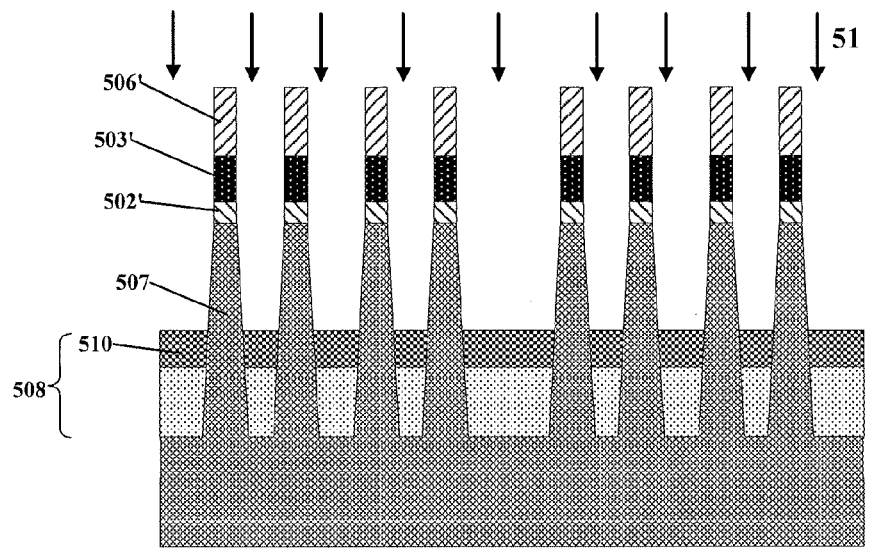
FIG. 5I is a schematic cross-sectional view of a structure illustrating an intermediate step of a method of forming a semiconductor device after a first dopant implantation according to an embodiment of the present invention.
Figure 5J:
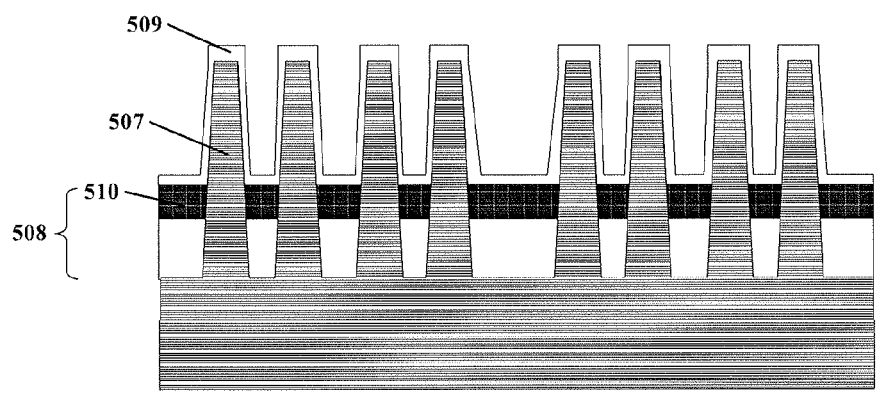
FIG. 5J is a schematic cross-sectional view of a structure illustrating an intermediate step of a method of forming a semiconductor device after forming a capping layer according to an embodiment of the present invention.
Figure 5K:
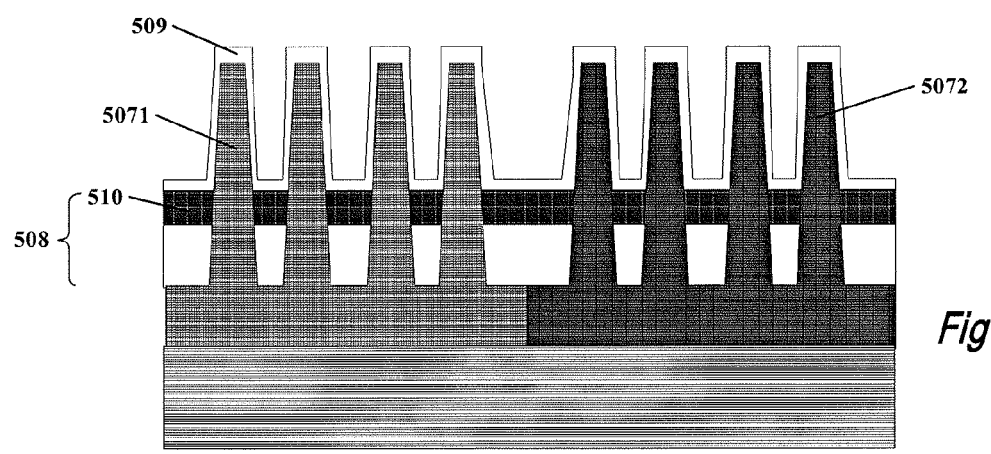
FIG. 5K is a schematic cross-sectional view of a structure illustrating an intermediate step of a method of forming a semiconductor device after a second dopant implantation according to an embodiment of the present invention.
Figure 5L:
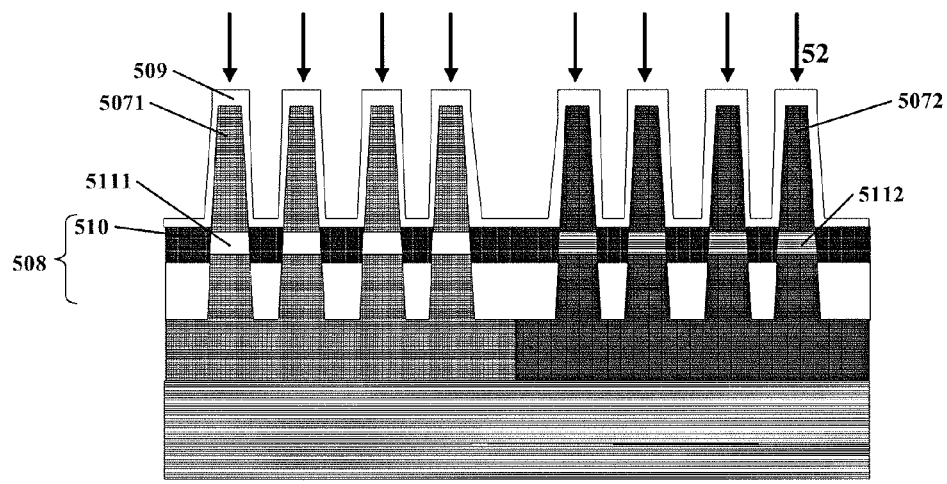
FIG. 5L is a schematic cross-sectional view of a structure illustrating an intermediate step of a method of forming a semiconductor device after a channel stop implantation according to an embodiment of the present invention.
Figure 5M:
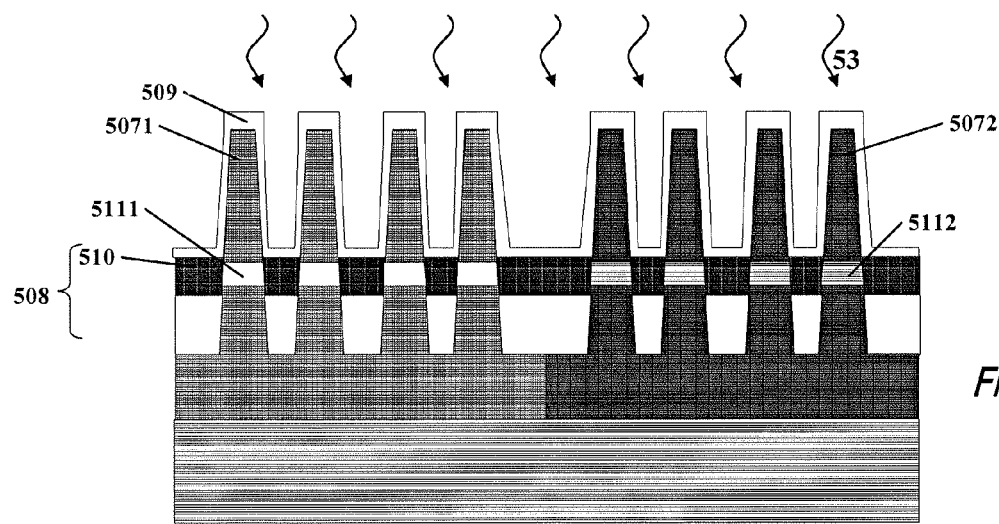
FIG. 5M is a schematic cross-sectional view of a structure illustrating an intermediate step of a method of forming a semiconductor device after an annealing treatment according to an embodiment of the present invention
Figure 5N:
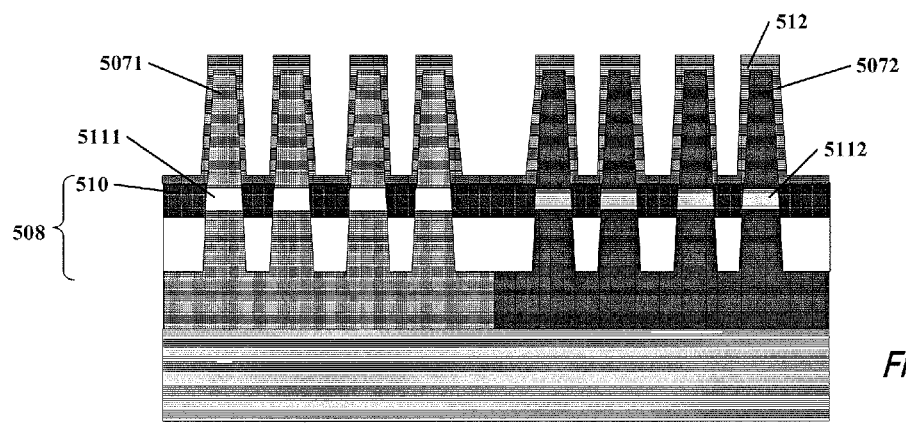
FIG. 5N is a schematic cross-sectional view of a structure illustrating an intermediate step of a method of forming a semiconductor device after forming a dummy gate insulation layer according to an embodiment of the present invention
Figure 5O:
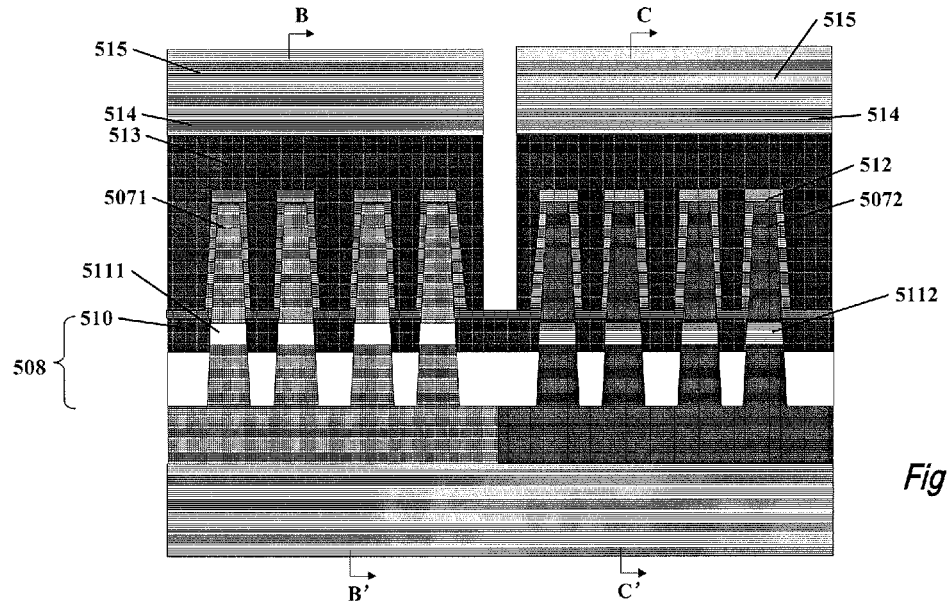
FIG. 5O is a schematic cross-sectional view of a structure illustrating an intermediate step of a method of forming a semiconductor device after forming a dummy gate according to an embodiment of the present invention
Figure 5P:
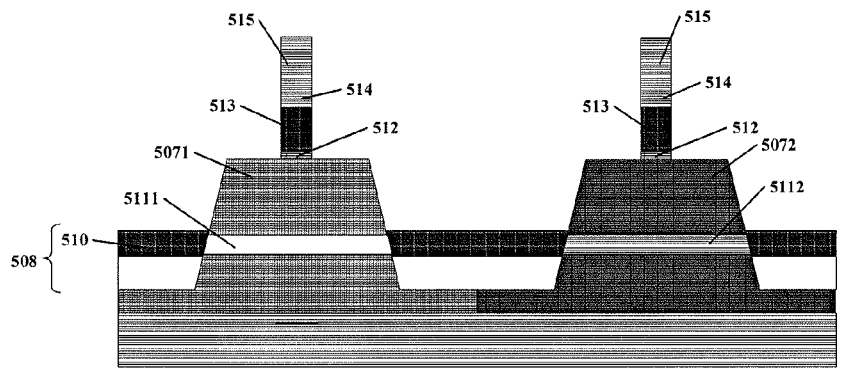
FIG. 5P is a schematic cross-sectional view of a structure illustrating an intermediate step of a method of forming a semiconductor device of FIG. 5O.
Figure 5Q:
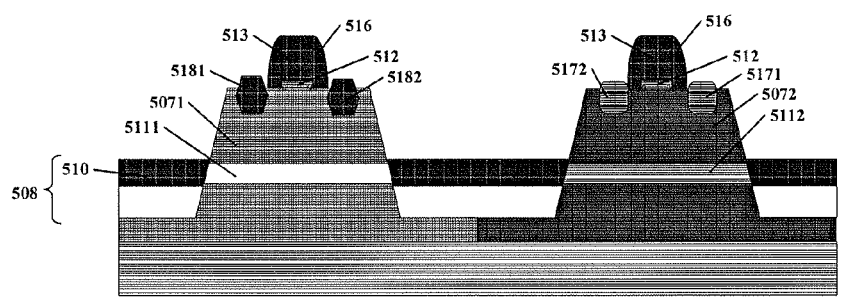
FIG. 5Q is a schematic cross-sectional view of a structure illustrating an intermediate step of a method of forming a semiconductor device after forming a second spacer according to an embodiment of the present invention.
Figure 5R:
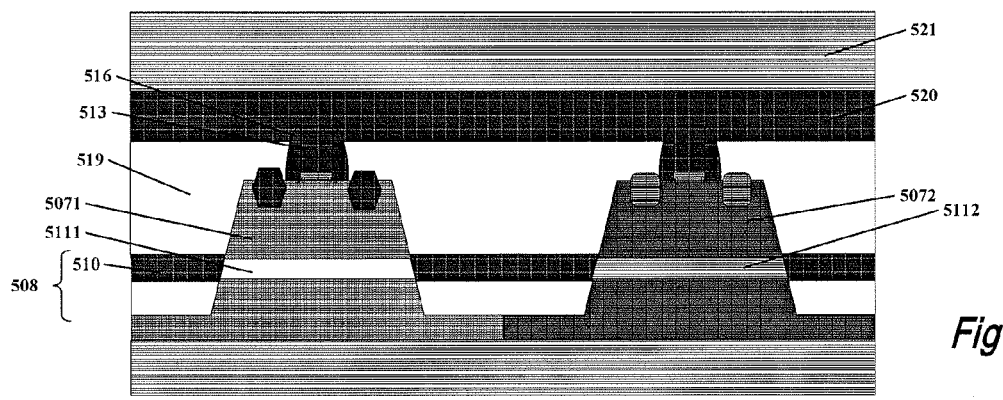
FIG. 5R is a schematic cross-sectional view of a structure illustrating an intermediate step of a method of forming a semiconductor device after forming interlayer dielectric layers according to an embodiment of the present invention.
Figure 5S:
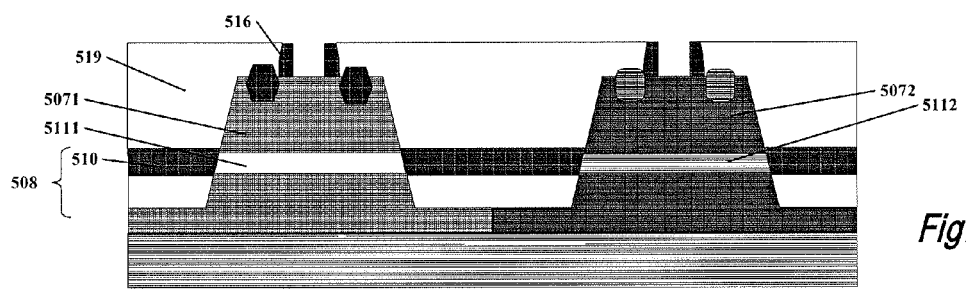
FIG. 5S is a schematic cross-sectional view of a structure illustrating an intermediate step of a method of forming a semiconductor device after removal the dummy gate according to an embodiment of the present invention.
Figure 5T:
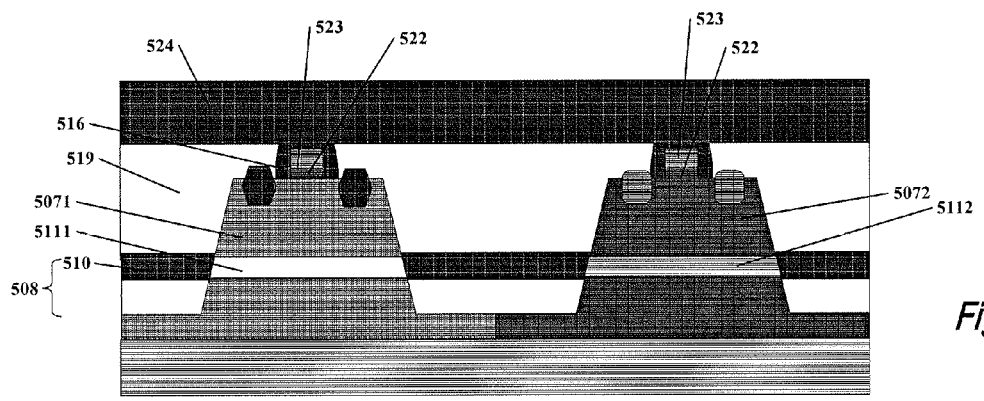
FIG. 5T is a schematic cross-sectional view of a structure illustrating an intermediate step of a method of forming a semiconductor device after forming a high-k dielectric layer, a gate, and a word line according to an embodiment of the present invention.

FIGS. 5A through 5T are schematic cross-sectional views of intermediate stages of a method for manufacturing a semiconductor device according to yet another embodiment of the present invention.

Referring to FIG. 5A, a substrate 500, e.g., a semiconductor substrate, is provided. An oxide layer 502 (e.g., silicon dioxide) is formed on the substrate 500, a first hard mask 503 (e.g., silicon nitride) is formed on the oxide layer 502, and a sacrificial layer 504 (e.g., amorphous carbon) is formed on the first hard mask 503.

Next, referring to FIG. 5B, a patterned mask 505 (e.g., photoresist) is formed on the sacrificial layer 504.

Next, referring to FIG. 5C, the sacrificial layer 504 is selectively etched using the patterned mask 505 as an etch stop layer to form a patterned sacrificial layer 504'. The mask 505 is then removed.

Next, referring to FIG. 5D, a first spacer 506 (e.g., silicon nitride) is formed by an atomic layer deposition (ALD) process on the first hard mask 503 and on the patterned sacrificial layer 504'.

Next, referring to FIG. 5E, an etching process (e.g., anisotropic etching) is performed onto the first spacer 506 to retain a portion 506' of the first spacer on opposite sides of the patterned sacrificial layer 504'.

Next, referring to FIG. 5F, the patterned sacrificial layer 504' is removed.

Next, referring to FIG. 5G, an etching process is performed onto the substrate 500 using the portion 506' of the first spacer and the first hard mask 503 as a mask to form fins 507.

Next, referring to FIG. 5H, a spacer material 508 is deposited to fill the trenches between the fins 507, and a planarization process is performed on the spacer material 508.

Next, referring to FIG. 5I, an etching process is performed on the spacer material 508 to remove a portion of the spacer material. A dopant implantation 51 is performed into the remaining portion of spacer material using the first spacer 506' and the first hard mask layer 503' as a mask, so that an etch stop layer 510 is formed in a portion below the upper surface of the spacer material 508.

Next, referring to FIG. 5J, the first spacer 506', the first hard mask layer 503', and the oxide material 502' are removed. A capping layer 509 is deposited.

Next, referring to FIG. 5K, a dopant implantation process is performed on the fins to form a well region. For example, a first conductivity type implantation is performed onto a first set of fins 5071, and a second conductivity type implantation is separately performed onto a second set of fins 5072. The first and second conductivity types are different conductivity types. For example, the first conductivity type is an N-type, and the second conductivity type is a P-type, or vice versa. Thereafter, a threshold voltage ion implantation is performed to adjust the threshold voltage Vt of a subsequently formed gate, as shown in FIG. 5K.

Next, referring to FIG. 5L, a channel stop implantation process 52 is separately performed into the first set of fins 5071 and into the second set of fins 5072 to form a first channel stop layer 5111 and a second channel stop layer 5112, respectively. The upper surface of the first and second channel stop layers 5111, 5112 is below the upper surface of the etch barrier layer 510. In certain embodiments, since the first and second sets of fins 5071 and 5072 have different conductivity types, the first and second channel stop layers 5111 and 5112 also have different conductivity types. For example, the conductivity type of the first set of fins 5071 is N-type (i.e., a PMOS device is formed in a subsequent step), the conductivity type of the first channel stop layer 5111 is also N-type. Similarly, the conductivity type of the second set of fins 5072 is P-type (i.e., an NMOS device is formed in a subsequent step), the conductivity type of the second channel stop layer 5112 is also P-type. The processes of forming the channel stop layer have been described in detail in sections above, and will not be repeated herein for the sake of brevity. Since the processes of forming the first and second channel stop layers 5111 and 5112 are different, the first and second channel stop layers 5111 and 5112 are formed separately. For example, the second set of fins is first masked using a first patterned photoresist, a first channel stop implantation is performed into the first set of fins to form the first channel stop layer 5111, then the first patterned photoresist is removed. Thereafter, the first set of fins is masked using a second patterned photoresist, a second channel stop implantation is performed into the second set of fins to form the second channel stop layers 5112, and the second patterned photoresist is then removed.

Next, referring to FIG. 5M, an annealing process 53 is performed on the semiconductor structure including the etch barrier layer 510.

Next, referring to FIG. 5N, the capping layer 509 is removed. A dummy gate insulation layer 512 (e.g., silicon dioxide) is deposited on the etch barrier layer 510, and the first and second sets of fins.

FIG. 5P is a schematic cross-sectional view of a portion of FIG. 5O taken along the line BB' and a portion of FIG. 5O taken along the line CC' in order to facilitate description of the present invention. With reference to FIGS. 5O and 5P, a dummy gate material 513 is deposited. An oxide buffer layer 514 and a second patterned hard mask layer 515 are sequentially deposited on the dummy gate material 513. An etching process is performed on the dummy gate material 513 using the second patterned hard mask layer 515 as a mask to form a patterned dummy gate 513. The dummy gate material may be polysilicon, The second hard mask layer may include oxide or nitride.

Next, referring to FIG. 5Q, the oxide buffer layer 514 and the second patterned hard mask layer 515 are removed. A second spacer 516 is formed on opposite sides of the dummy gate 513. A first source 5181 and a first drain 5182 are epitaxially formed adjacent the first set of fins 5071 having the first conductivity type. A first source 5171 and a first drain 5172 are epitaxially formed adjacent the second set of fins 5072 having the second conductivity type. For example, the first source 5181 and a first drain 5182 include SiGe. The first source 5171 and a first drain 5172 include SiC.

Next, referring to FIG. 5R, an interlayer dielectric 519 is deposited in the trenches between the fins. A high density plasma (HDP) oxide 520 and a plasma enhanced TEOS (PETEOS) oxide 521 are sequentially deposited on the interlayer dielectric 519. The HDP oxide 520 and the PETEOS oxide 521 can be beneficial in obtaining fewer defects in a subsequent planarization process.

Next, referring to FIG. 5S, the HDP oxide 520 and the PETEOS oxide 521 are removed. The interlayer dielectric 519 is planarized until an upper surface of the dummy gate 513 is exposed. A selective etching is performed to remove the dummy gate 513 and the dummy gate insulation material 512. For example, an etching using HF/SiCoNi is performed to remove the dummy gate insulation material 512.

Next, referring to FIG. 5T, a high dielectric constant (high-k) gate dielectric 522, a gate 523 (i.e., a high-k gate), and a word line are formed by deposition.

Thus, at least two fin-type semiconductor devices can be formed on the same substrate. Since the etch stop layer includes a composition comprising silicon and/or carbon, and oxide or nitride, the etch rate of the HF/SiCoNi on oxide (e.g., silicon oxide) can be reduced, so that the spacer loss due to the HF/SiCoNi etching can be reduced, thereby improving the device performance.

Embodiments of the present invention also provide a fin-type semiconductor device. Referring back to FIG. 3H, the fin-type semiconductor device includes a base layer 301, a semiconductor structure comprising a plurality of fins 302 (only one fin is shown for clarity), a trench 320 (trench 320 disposed between two adjacent fins shown in FIG. 3B), and a spacer 303 filling a portion of the trench. The spacer 303 includes an etch stop layer 305 disposed below its upper surface. The etch stop layer may include silicon and/or carbon.

In some embodiments, as shown in FIG. 3B, the upper surface of the etch stop layer 305 is the upper surface of the spacer 303. In other embodiments, the upper surface of the etch stop layer 305 may be below the upper surface of the spacer 303, it is important to ensure that the upper surface of the etch stop layer is above the upper surface of the channel stop layer.

In some embodiments, a channel stop layer 304 is formed in the fin 302. The channel stop layer 304 has an upper surface that is lower than the upper surface of the etch stop layer 305.

In some embodiments, the fin-type semiconductor device also includes a high dielectric constant (high-k) dielectric layer on the fin 312, a gate 313 on the high-k dielectric layer, a source 308 and a drain 309. The gate may be titanium, aluminum, tantalum, potassium, and the like.

In some embodiments, the fin-type semiconductor device further includes spacers 310 disposed between the gate 313 and the source 308, and between the gate 313 and the drain 309, an interlayer dielectric layer 311 disposed between the fins, and a word line 314 in electrical contact with the gate 313, as shown in FIG. 3H.

In some embodiments, the fin-type semiconductor device nay include two fin-type semiconductor devices of different conductivity types, as shown in FIG. 5T.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a fin-type semiconductor device, the method comprising:
    providing a semiconductor structure comprising a plurality of fins and a plurality of trenches each disposed between two adjacent fins;
    filling each of the trenches with a spacer;
    performing a first dopant implantation into the spacer to form an etch stop layer;
    submitting the etch stop layer to an annealing treatment at a temperature in a range between 850° C. and 1050° C., and
    performing a channel stop implantation process into the fins to form a channel stop layer, wherein the formed channel stop layer has an upper surface below an upper surface of the etch stop layer.

2. The method of claim 1, wherein the first dopant implantation comprises silicon, carbon, or a combination thereof.

3. The method of claim 1, wherein the etch stop layer has an upper surface that is an upper surface of the spacer.

4. The method of claim 1, wherein the first dopant implantation is an ion implantation comprising silicon ions, carbon ions, or a combination thereof.

5. The method of claim 4, wherein the ion implantation is performed in a perpendicular direction to the upper surface of the spacer at an energy in a range between 0.5 keV and 3 keV, and with a doping concentration in a range between $1.0 \times 10^{15}$ and $8.0 \times 10^{16}$ atoms/cm$^3$.

6. The method of claim 1, further comprising:
    forming a dummy gate insulation layer on the fins, a dummy gate on the dummy gate insulation layer, a source and drain adjacent the dummy gate;
    forming an interlayer dielectric layer to insulate the fins;
    removing the dummy gate and the dummy gate insulation layer; and
    forming a high-k dielectric layer and a gate on each of the fins.

7. The method of claim 1, wherein providing the semiconductor structure comprises:
    providing a substrate;
    performing a second dopant implantation into the substrate to form a well region;
    forming a patterned hard mask on the well region;
    performing an etching process onto the substrate using the patterned hard mask as a mask to form a fin structure having the plurality of fins and the plurality of trenches;
    filling each of the trenches with a spacer comprising an oxide liner and a filler material;
    planarizing the spacer until a surface of the hard mask is exposed;
    performing an etching process into the spacer to remove a portion of the spacer.

* * * * *